United States Patent
Hamada et al.

(10) Patent No.: US 7,255,083 B2
(45) Date of Patent: *Aug. 14, 2007

(54) SLIDING STRUCTURE FOR AUTOMOTIVE ENGINE

(75) Inventors: Takahiro Hamada, Yokohama (JP); Yutaka Mabuchi, Yokohama (JP); Makoto Kano, Yokohama (JP); Yoshiteru Yasuda, Yokohama (JP); Yusuke Okamoto, Kanagawa (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/118,360

(22) Filed: May 2, 2005

(65) Prior Publication Data

US 2005/0188942 A1    Sep. 1, 2005

Related U.S. Application Data

(63) Continuation of application No. 10/682,559, filed on Oct. 10, 2003, now Pat. No. 6,886,521.

(51) Int. Cl.
 *B26D 5/00*    (2006.01)
(52) U.S. Cl. .................... 123/193.4; 427/450
(58) Field of Classification Search .. 123/193.1–193.6; 427/450, 540, 250; 428/698, 217; 92/158
 See application file for complete search history.

(56) References Cited

U.S. PATENT DOCUMENTS

| 1,461 | A | 12/1839 | Day |
| 2,716,972 | A | 9/1955 | Farny et al. |
| 2,982,733 | A | 5/1961 | Wright et al. |
| 3,211,647 | A | 10/1965 | O'Halloran et al. |
| 3,790,315 | A | 2/1974 | Emanuelsson et al. |
| 3,846,162 | A | 11/1974 | Bloom |

(Continued)

FOREIGN PATENT DOCUMENTS

| CA | 2009582 | 8/1990 |

(Continued)

OTHER PUBLICATIONS

"Chromium Steels", Japanese Industrial Standard, 1979, pp. 1-9, JIS G 4104, Japanese Standards Association, Japan.

(Continued)

*Primary Examiner*—Marguerite McMahon
(74) *Attorney, Agent, or Firm*—Foley & Lardner LLP (57) ABSTRACT

A sliding structure for an automotive engine includes a sliding member with a sliding portion and a lubricant applied to the sliding portion so that the sliding portion can make sliding contact with a counterpart member via the lubricant. The sliding member is either of a piston ring, a piston pin, a cam lobe, a cam journal, a plain bearing, a rotary vane and a timing chain. The sliding portion has a base made of a steel or aluminum material and a hard carbon film formed on the base to coat the sliding portion. The hard carbon film has a thickness of 0.3 to 2.0 µm, a Knoop hardness of 1500 to 4500 kg/mm$^2$, a surface roughness Ry (µm) satisfying the following equation: Ry<{(0.75−Hk/8000)×h+0.07/0.8}, where h is the thickness (µm) of the film; and Hk is the Knoop hardness (kg/mm$^2$) of the film.

9 Claims, 1 Drawing Sheet

U.S. PATENT DOCUMENTS

| | | |
|---|---|---|
| 3,932,228 A | 1/1976 | Sugiyama et al. |
| 4,031,023 A | 6/1977 | Musser et al. |
| 4,367,130 A | 1/1983 | Lemelson |
| 4,385,880 A | 5/1983 | Lemelson |
| 4,538,929 A | 9/1985 | Ehrentraut et al. |
| 4,554,208 A | 11/1985 | MacIver et al. |
| 4,645,610 A | 2/1987 | Born et al. |
| 4,702,808 A | 10/1987 | Lemelson |
| 4,712,982 A | 12/1987 | Inagaki et al. |
| 4,755,237 A | 7/1988 | Lemelson |
| 4,755,426 A | 7/1988 | Kokai et al. |
| 4,783,368 A | 11/1988 | Yamamoto et al. |
| 4,834,400 A | 5/1989 | Lebeck |
| 4,842,755 A | 6/1989 | Dunn |
| 4,859,493 A | 8/1989 | Lemelson |
| 4,874,596 A | 10/1989 | Lemelson |
| 4,919,974 A | 4/1990 | McCune et al. |
| 4,933,058 A | 6/1990 | Bache et al. |
| 4,943,345 A | 7/1990 | Asmussen et al. |
| 4,960,643 A | 10/1990 | Lemelson |
| 4,974,498 A | 12/1990 | Lemelson |
| 4,980,021 A | 12/1990 | Kitamura et al. |
| 4,980,610 A | 12/1990 | Varga |
| 4,981,717 A | 1/1991 | Thaler |
| 4,988,421 A | 1/1991 | Drawl et al. |
| 4,992,082 A | 2/1991 | Drawl et al. |
| 5,000,541 A | 3/1991 | DiMarcello et al. |
| 5,021,628 A | 6/1991 | Lemelson |
| 5,032,243 A | 7/1991 | Bache et al. |
| 5,036,211 A | 7/1991 | Scott |
| 5,040,501 A | 8/1991 | Lemelson |
| 5,067,826 A | 11/1991 | Lemelson |
| 5,077,990 A | 1/1992 | Plath |
| 5,078,848 A | 1/1992 | Anttila et al. |
| 5,087,608 A | 2/1992 | Chan et al. |
| 5,096,352 A | 3/1992 | Lemelson |
| 5,110,435 A | 5/1992 | Haberland |
| 5,112,025 A | 5/1992 | Nakayama et al. |
| 5,127,314 A | 7/1992 | Swain |
| 5,131,941 A | 7/1992 | Lemelson |
| 5,132,587 A | 7/1992 | Lemelson |
| 5,142,785 A | 9/1992 | Grewal et al. |
| 5,143,634 A | 9/1992 | Quinga et al. |
| 5,148,780 A | 9/1992 | Urano et al. |
| 5,187,021 A | 2/1993 | Vydra et al. |
| 5,190,807 A | 3/1993 | Kimock et al. |
| 5,190,824 A | 3/1993 | Itoh |
| 5,202,156 A | 4/1993 | Yamamoto et al. |
| 5,205,188 A | 4/1993 | Repenning et al. |
| 5,205,305 A | 4/1993 | Yamakita |
| H1210 H | 7/1993 | Jansen |
| 5,232,568 A | 8/1993 | Parent et al. |
| 5,237,967 A | 8/1993 | Willermet et al. |
| 5,249,554 A | 10/1993 | Tamor et al. |
| 5,255,783 A | 10/1993 | Goodman et al. |
| 5,255,929 A | 10/1993 | Lemelson |
| 5,284,394 A | 2/1994 | Lemelson |
| 5,288,556 A | 2/1994 | Lemelson |
| 5,295,305 A | 3/1994 | Hahn et al. |
| 5,299,937 A | 4/1994 | Gow |
| 5,317,938 A | 6/1994 | de Juan, Jr. et al. |
| 5,326,488 A | 7/1994 | Minokami et al. |
| 5,332,348 A | 7/1994 | Lemelson |
| 5,334,306 A | 8/1994 | Dautremont-Smith et al. |
| 5,349,265 A | 9/1994 | Lemelson |
| 5,358,402 A | 10/1994 | Reed et al. |
| 5,359,170 A | 10/1994 | Chen et al. |
| 5,360,227 A | 11/1994 | Lemelson |
| 5,380,196 A | 1/1995 | Kelly et al. |
| 5,401,543 A | 3/1995 | O'Neill et al. |
| H1461 H | 7/1995 | DiVita et al. |
| 5,432,539 A | 7/1995 | Anderson |
| 5,433,977 A | 7/1995 | Sarin et al. |
| H1471 H | 8/1995 | Braun et al. |
| 5,443,032 A | 8/1995 | Vichr et al. |
| 5,447,208 A | 9/1995 | Lund et al. |
| 5,456,406 A | 10/1995 | Lemelson |
| 5,458,754 A | 10/1995 | Sathrum et al. |
| 5,461,648 A | 10/1995 | Nauflett et al. |
| 5,462,772 A | 10/1995 | Lemelson |
| 5,464,667 A | 11/1995 | Köhler et al. |
| 5,466,431 A | 11/1995 | Dorfman et al. |
| 5,479,069 A | 12/1995 | Winsor |
| 5,482,602 A | 1/1996 | Cooper et al. |
| 5,491,028 A | 2/1996 | Sarin et al. |
| 5,497,550 A | 3/1996 | Trotta et al. |
| 5,509,841 A | 4/1996 | Winsor |
| 5,516,729 A | 5/1996 | Dawson et al. |
| 5,529,815 A | 6/1996 | Lemelson |
| 5,531,878 A | 7/1996 | Vadgama et al. |
| 5,541,566 A | 7/1996 | Deeney |
| 5,547,716 A | 8/1996 | Thaler |
| 5,551,959 A | 9/1996 | Martin et al. |
| 5,552,675 A | 9/1996 | Lemelson |
| 5,568,391 A | 10/1996 | Mckee |
| 5,593,719 A | 1/1997 | Dearnaley et al. |
| 5,616,372 A | 4/1997 | Conley et al. |
| 5,619,889 A | 4/1997 | Jones et al. |
| 5,628,881 A | 5/1997 | Lemelson |
| 5,630,275 A | 5/1997 | Wexler |
| 5,630,953 A | 5/1997 | Klink |
| 5,653,300 A | 8/1997 | Lund et al. |
| 5,669,144 A | 9/1997 | Hahn et al. |
| 5,672,054 A | 9/1997 | Cooper et al. |
| 5,688,557 A | 11/1997 | Lemelson et al. |
| 5,707,409 A | 1/1998 | Martin et al. |
| 5,714,202 A | 2/1998 | Lemelson et al. |
| 5,719,109 A | 2/1998 | Tokashiki et al. |
| 5,723,207 A | 3/1998 | Lettington et al. |
| 5,731,046 A | 3/1998 | Mistry et al. |
| 5,735,769 A | 4/1998 | Takemura et al. |
| 5,740,941 A | 4/1998 | Lemelson |
| 5,775,817 A | 7/1998 | Gottemoller et al. |
| 5,786,038 A | 7/1998 | Conley et al. |
| 5,790,146 A | 8/1998 | Anderson |
| 5,793,390 A | 8/1998 | Claflin et al. |
| 5,794,801 A | 8/1998 | Lemelson |
| 5,799,549 A | 9/1998 | Decker et al. |
| 5,806,557 A | 9/1998 | Helge |
| 5,824,387 A | 10/1998 | Boutaghou et al. |
| 5,834,708 A | 11/1998 | Svetal et al. |
| 5,840,662 A | 11/1998 | Nibert et al. |
| 5,843,571 A | 12/1998 | Sho |
| 5,851,962 A | 12/1998 | Kaga |
| 5,866,195 A | 2/1999 | Lemelson |
| 5,871,805 A | 2/1999 | Lemelson |
| 5,881,444 A | 3/1999 | Schaefer et al. |
| 5,901,021 A | 5/1999 | Hirano et al. |
| 5,910,940 A | 6/1999 | Guerra |
| 5,927,897 A | 7/1999 | Attar |
| 5,937,812 A | 8/1999 | Reedy et al. |
| 5,940,975 A | 8/1999 | Decker et al. |
| 5,945,214 A | 8/1999 | Ma et al. |
| 5,947,710 A | 9/1999 | Cooper et al. |
| 5,952,102 A | 9/1999 | Cutler |
| 5,958,261 A | 9/1999 | Offer et al. |
| 5,960,762 A | 10/1999 | Imai |
| 5,967,250 A | 10/1999 | Lund et al. |
| 5,968,596 A | 10/1999 | Ma et al. |
| 5,975,686 A | 11/1999 | Hauck et al. |
| 5,976,707 A | 11/1999 | Grab |
| 5,992,268 A | 11/1999 | Decker et al. |
| 5,993,938 A | 11/1999 | Tsukuda et al. |
| 6,006,415 A | 12/1999 | Schaefer et al. |

| | | | |
|---|---|---|---|
| 6,015,597 A | 1/2000 | David | |
| 6,016,000 A | 1/2000 | Moslehi | |
| 6,023,979 A | 2/2000 | Bills et al. | |
| 6,028,393 A | 2/2000 | Izu et al. | |
| 6,051,298 A | 4/2000 | Ko et al. | |
| 6,056,443 A | 5/2000 | Koike et al. | |
| 6,059,460 A | 5/2000 | Ono et al. | |
| 6,059,830 A | 5/2000 | Lippincott, III et al. | |
| 6,071,597 A | 6/2000 | Yang et al. | |
| 6,083,313 A | 7/2000 | Venkatraman et al. | |
| 6,083,570 A | 7/2000 | Lemelson et al. | |
| 6,095,690 A | 8/2000 | Niegel et al. | |
| 6,099,541 A | 8/2000 | Klopotek | |
| 6,099,976 A | 8/2000 | Lemelson et al. | |
| 6,106,919 A | 8/2000 | Lee et al. | |
| 6,124,198 A | 9/2000 | Moslehi | |
| 6,139,964 A | 10/2000 | Sathrum et al. | |
| 6,142,481 A | 11/2000 | Iwashita et al. | |
| 6,145,608 A | 11/2000 | Lund et al. | |
| 6,156,439 A | 12/2000 | Coffinberry | |
| 6,159,558 A | 12/2000 | Wolfe et al. | |
| 6,160,683 A | 12/2000 | Boutaghou | |
| 6,165,616 A | 12/2000 | Lemelson et al. | |
| 6,170,156 B1 | 1/2001 | Lev et al. | |
| 6,171,343 B1 | 1/2001 | Dearnaley et al. | |
| 6,173,913 B1 | 1/2001 | Shafer et al. | |
| 6,190,514 B1 | 2/2001 | Ma et al. | |
| 6,193,906 B1 | 2/2001 | Kaneko et al. | |
| 6,197,120 B1 | 3/2001 | David | |
| 6,197,428 B1 | 3/2001 | Rogers | |
| 6,203,651 B1 | 3/2001 | Järvenkylä et al. | |
| 6,205,291 B1 | 3/2001 | Hughes et al. | |
| 6,207,625 B1 | 3/2001 | Ogano et al. | |
| 6,227,056 B1 | 5/2001 | Bills et al. | |
| 6,237,441 B1 | 5/2001 | Nishioka et al. | |
| 6,237,852 B1 | 5/2001 | Svetal et al. | |
| 6,238,839 B1 | 5/2001 | Tomita et al. | |
| 6,255,262 B1 | 7/2001 | Keenan et al. | |
| 6,261,424 B1 | 7/2001 | Goncharenko et al. | |
| 6,273,793 B1 | 8/2001 | Liners et al. | |
| 6,274,220 B1 | 8/2001 | Tsukuda et al. | |
| 6,289,593 B1 | 9/2001 | Decker et al. | |
| 6,293,648 B1 | 9/2001 | Anderson | |
| 6,296,552 B1 | 10/2001 | Boutaghou et al. | |
| 6,299,425 B1 | 10/2001 | Hirano et al. | |
| 6,305,416 B1 | 10/2001 | Snel et al. | |
| 6,309,283 B1 | 10/2001 | Liners et al. | |
| 6,311,524 B1 | 11/2001 | Brennan, III et al. | |
| 6,316,734 B1 | 11/2001 | Yang | |
| 6,322,431 B1 | 11/2001 | Schaenzer et al. | |
| 6,322,719 B2 | 11/2001 | Kaneko et al. | |
| 6,324,060 B1 | 11/2001 | Hsu | |
| 6,325,385 B1 | 12/2001 | Iwashita et al. | |
| 6,329,328 B1 | 12/2001 | Koganei et al. | |
| 6,333,298 B1 | 12/2001 | Waddoups et al. | |
| 6,338,881 B1 | 1/2002 | Sellschopp et al. | |
| 6,340,245 B1 | 1/2002 | Horton et al. | |
| 6,358,123 B1 | 3/2002 | Liners et al. | |
| 6,367,705 B1 | 4/2002 | Lee et al. | |
| 6,368,676 B1 | 4/2002 | Gaudreau et al. | |
| 6,377,422 B1 | 4/2002 | Boutaghou et al. | |
| 6,379,383 B1 | 4/2002 | Palmaz et al. | |
| 6,385,987 B2 | 5/2002 | Schlom et al. | |
| 6,386,468 B1 | 5/2002 | Neuberger et al. | |
| 6,399,215 B1 | 6/2002 | Zhu et al. | |
| 6,401,058 B1 | 6/2002 | Akalin et al. | |
| 6,439,845 B1 | 8/2002 | Veres | |
| 6,439,986 B1 | 8/2002 | Myoung et al. | |
| 6,452,752 B1 | 9/2002 | Boutaghou | |
| 6,468,642 B1 | 10/2002 | Bray et al. | |
| 6,471,979 B2 | 10/2002 | New et al. | |
| 6,494,881 B1 | 12/2002 | Bales et al. | |
| 6,523,456 B1 | 2/2003 | Kobayashi et al. | |
| 6,524,212 B2 | 2/2003 | Ushijima et al. | |
| 6,534,141 B1 | 3/2003 | Hull, Jr. et al. | |
| 6,537,310 B1 | 3/2003 | Palmaz et al. | |
| 6,537,429 B2 | 3/2003 | O'Donnell et al. | |
| 6,543,394 B2 | 4/2003 | Tinney | |
| 6,544,308 B2 | 4/2003 | Griffin et al. | |
| 6,553,957 B1 | 4/2003 | Ishikawa et al. | |
| 6,557,968 B2 | 5/2003 | Lee et al. | |
| 6,562,445 B2 | 5/2003 | Iwamura | |
| 6,562,462 B2 | 5/2003 | Griffin et al. | |
| 6,570,172 B2 | 5/2003 | Kim et al. | |
| 6,572,651 B1 | 6/2003 | DeScheerder et al. | |
| 6,572,935 B1 | 6/2003 | He et al. | |
| 6,572,937 B2 | 6/2003 | Hakovirta et al. | |
| 6,585,064 B2 | 7/2003 | Griffin et al. | |
| 6,586,069 B2 | 7/2003 | Dykes et al. | |
| 6,589,640 B2 | 7/2003 | Griffin et al. | |
| 6,592,519 B1 | 7/2003 | Martinez | |
| 6,592,985 B2 | 7/2003 | Griffin et al. | |
| 6,601,662 B2 | 8/2003 | Matthias et al. | |
| 6,626,949 B1 | 9/2003 | Townley | |
| 6,637,528 B2 | 10/2003 | Nishiyama et al. | |
| 6,638,569 B2 | 10/2003 | McLaughlin et al. | |
| 6,645,354 B1 | 11/2003 | Gorokhovsky | |
| 6,656,329 B1 | 12/2003 | Ma et al. | |
| 6,658,941 B1 | 12/2003 | Bills et al. | |
| 6,666,328 B2 | 12/2003 | Sykora | |
| 6,666,671 B1 | 12/2003 | Olver et al. | |
| 6,684,513 B1 | 2/2004 | Clipstone et al. | |
| 6,684,759 B1 | 2/2004 | Gorokhovsky | |
| 6,695,865 B2 | 2/2004 | Boyle et al. | |
| 6,699,106 B2 | 3/2004 | Myoung et al. | |
| 6,701,627 B2 | 3/2004 | Korb et al. | |
| 6,715,693 B1 | 4/2004 | Dam et al. | |
| 6,726,993 B2 | 4/2004 | Teer et al. | |
| 6,729,350 B2 | 5/2004 | Schick | |
| 6,729,527 B2 | 5/2004 | Sonnenreich et al. | |
| 6,733,513 B2 | 5/2004 | Boyle et al. | |
| 6,739,214 B2 | 5/2004 | Griffin et al. | |
| 6,739,238 B2 | 5/2004 | Ushijima et al. | |
| 6,740,393 B1 * | 5/2004 | Massler et al. | 428/216 |
| 6,745,742 B2 | 6/2004 | Meyer | |
| 6,749,033 B2 | 6/2004 | Griffin et al. | |
| 6,753,042 B1 | 6/2004 | Bakounine et al. | |
| 6,753,635 B2 | 6/2004 | Kuhlmann-Wilsdorf | |
| 6,761,532 B2 | 7/2004 | Capone et al. | |
| 6,761,736 B1 | 7/2004 | Woo et al. | |
| 6,780,177 B2 | 8/2004 | Shafirstein et al. | |
| 6,797,326 B2 | 9/2004 | Griffin et al. | |
| 6,799,468 B2 | 10/2004 | Borenstein | |
| 6,806,242 B2 | 10/2004 | Shirahama et al. | |
| 6,818,029 B2 | 11/2004 | Myoung et al. | |
| 6,820,676 B2 | 11/2004 | Palmaz et al. | |
| 6,821,189 B1 | 11/2004 | Coad et al. | |
| 6,821,624 B2 * | 11/2004 | Utsumi et al. | 428/408 |
| 6,822,788 B2 | 11/2004 | Blitstein | |
| 6,849,085 B2 | 2/2005 | Marton | |
| 6,855,237 B2 | 2/2005 | Kolpakov et al. | |
| 6,855,791 B2 | 2/2005 | Van Doren et al. | |
| 6,861,098 B2 | 3/2005 | Griffin et al. | |
| 6,861,137 B2 | 3/2005 | Griffin et al. | |
| 6,865,952 B2 | 3/2005 | Bills et al. | |
| 6,866,894 B2 | 3/2005 | Trankiem et al. | |
| 6,871,700 B2 | 3/2005 | Gorokhovsky | |
| 6,872,203 B2 | 3/2005 | Shafirstein et al. | |
| 6,878,447 B2 | 4/2005 | Griffin et al. | |
| 6,880,469 B2 | 4/2005 | Frost | |
| 6,882,094 B2 | 4/2005 | Dimitrijevic et al. | |
| 6,885,521 B2 | 4/2005 | Kikuchi | |
| 6,886,521 B2 * | 5/2005 | Hamada et al. | 123/193.4 |
| 6,887,585 B2 | 5/2005 | Herbst-Dederichs | |
| 6,890,700 B2 | 5/2005 | Tomita et al. | |
| 6,893,720 B1 * | 5/2005 | Nakahigashi et al. | 428/408 |

| | | | | | | |
|---|---|---|---|---|---|---|
| 6,969,198 | B2 | 11/2005 | Konishi et al. | 2005/0115744 A1 | 6/2005 | Griffin et al. |
| 2001/0036800 | A1 | 11/2001 | Liners et al. | | | |
| 2002/0026899 | A1 | 3/2002 | McLaughlin et al. | FOREIGN PATENT DOCUMENTS | | |
| 2002/0031987 | A1 | 3/2002 | Liners et al. | | | |
| 2002/0034631 | A1 | 3/2002 | Griffin et al. | DE | 643 034 | 3/1937 |
| 2002/0034632 | A1 | 3/2002 | Griffin et al. | DE | 19507086 A1 | 9/1996 |
| 2002/0051286 | A1 | 5/2002 | Blitstein | DE | 19507086 C2 | 9/1996 |
| 2002/0070357 | A1 | 6/2002 | Kim et al. | DE | 197 04 224 | 8/1997 |
| 2002/0074168 | A1 | 6/2002 | Matthias et al. | DE | 198 15 989 | 10/1999 |
| 2002/0089571 | A1 | 7/2002 | Lee et al. | DE | 198 25 860 | 12/1999 |
| 2002/0090155 | A1 | 7/2002 | Ushijima et al. | DE | 19825860 A1 | 12/1999 |
| 2002/0090578 | A1 | 7/2002 | Schaefera et al. | DE | 100 17 459 | 10/2000 |
| 2002/0130219 | A1 | 9/2002 | Parseghian et al. | DE | 100 67 397 A1 | 5/2002 |
| 2002/0148430 | A1 | 10/2002 | Kano et al. | DE | 101 58 683 | 6/2003 |
| 2002/0155015 | A1 | 10/2002 | Esumi et al. | DE | 103 18 135 | 11/2003 |
| 2002/0175476 | A1 | 11/2002 | Chinou et al. | DE | 10337559 A1 | 3/2005 |
| 2003/0012234 | A1 | 1/2003 | Watson et al. | EP | 0 286 996 | 10/1988 |
| 2003/0019111 | A1 | 1/2003 | Korb et al. | EP | 0 291 006 A2 | 11/1988 |
| 2003/0019332 | A1 | 1/2003 | Korb et al. | EP | 0 299 785 | 1/1989 |
| 2003/0021995 | A1 | 1/2003 | Griffin et al. | EP | 0308143 B1 | 3/1989 |
| 2003/0034182 | A1 | 2/2003 | Griffin et al. | EP | 0 333 416 A1 | 9/1989 |
| 2003/0035957 | A1 | 2/2003 | Griffin et al. | EP | 0378378 B1 | 7/1990 |
| 2003/0035958 | A1 | 2/2003 | Griffin et al. | EP | 0384772 A1 | 8/1990 |
| 2003/0036341 | A1 | 2/2003 | Myoung et al. | EP | 0388800 A2 | 9/1990 |
| 2003/0037640 | A1 | 2/2003 | Griffin et al. | EP | 0392125 A1 | 10/1990 |
| 2003/0069632 | A1 | 4/2003 | De Scheerder et al. | EP | 0398985 B1 | 11/1990 |
| 2003/0108777 | A1 | 6/2003 | Gunsel et al. | EP | 407977 | 1/1991 |
| 2003/0114094 | A1 | 6/2003 | Myoung et al. | EP | 0 435 312 | 7/1991 |
| 2003/0128903 | A1 | 7/2003 | Yasuda et al. | EP | 0474369 A1 | 3/1992 |
| 2003/0159919 | A1 | 8/2003 | Fairbairn et al. | EP | 0 500 253 | 8/1992 |
| 2003/0162672 | A1 | 8/2003 | Shirahama et al. | EP | 0511153 A1 | 10/1992 |
| 2003/0168323 | A1 | 9/2003 | Frost | EP | 0 529 327 | 3/1993 |
| 2003/0180565 | A1 | 9/2003 | Herbst-Dederichs | EP | 0392125 B1 | 3/1993 |
| 2003/0199741 | A1 | 10/2003 | Martinez | EP | 0546824 A1 | 6/1993 |
| 2003/0234371 | A1 | 12/2003 | Ziegler | EP | 0308143 A1 | 11/1993 |
| 2003/0235691 | A1 | 12/2003 | Griffin et al. | EP | 0573943 A1 | 12/1993 |
| 2004/0003638 | A1 | 1/2004 | Schaefer et al. | EP | 0619504 A1 | 10/1994 |
| 2004/0008406 | A1 | 1/2004 | Blitstein | EP | 0621136 A2 | 10/1994 |
| 2004/0010068 | A1 | 1/2004 | Doren et al. | EP | 0624353 A3 | 11/1994 |
| 2004/0011900 | A1 | 1/2004 | Gebhardt et al. | EP | 0624354 A3 | 11/1994 |
| 2004/0027018 | A1 | 2/2004 | LeBlanc et al. | EP | 0378378 B1 | 1/1995 |
| 2004/0035375 | A1 | 2/2004 | Gibisch et al. | EP | 0651069 A1 | 5/1995 |
| 2004/0074467 | A1 | 4/2004 | Hamada et al. | EP | 0652301 A1 | 5/1995 |
| 2004/0092405 | A1 | 5/2004 | Konishi et al. | EP | 0656458 A3 | 6/1995 |
| 2004/0105806 | A1 | 6/2004 | Griffin et al. | EP | 0 661 470 | 7/1995 |
| 2004/0109621 | A1 | 6/2004 | Frost | EP | 0396603 B1 | 6/1996 |
| 2004/0115435 | A1 | 6/2004 | Griffin et al. | EP | 0 731 190 | 9/1996 |
| 2004/0133301 | A1 | 7/2004 | Van Doren et al. | EP | 0388800 B1 | 12/1996 |
| 2004/0154570 | A1 | 8/2004 | Mabuchi et al. | EP | 0 759 519 | 2/1997 |
| 2004/0168326 | A1 | 9/2004 | Korb et al. | EP | 0474369 B1 | 3/1997 |
| 2004/0184687 | A1 | 9/2004 | Morales et al. | EP | 0 818 622 | 1/1998 |
| 2004/0223256 | A1 | 11/2004 | Feng et al. | EP | 0652301 B1 | 1/1998 |
| 2004/0241448 | A1 | 12/2004 | Kano et al. | EP | 0826790 A1 | 3/1998 |
| 2004/0242435 | A1 | 12/2004 | Nishimura et al. | EP | 0842754 A1 | 5/1998 |
| 2004/0244539 | A1 | 12/2004 | Korb et al. | EP | 0 870 820 | 10/1998 |
| 2004/0261614 | A1 | 12/2004 | Hamada et al. | EP | 0816112 A3 | 10/1998 |
| 2005/0001201 | A1 | 1/2005 | Bocko et al. | EP | 0882759 A1 | 12/1998 |
| 2005/0005892 | A1 | 1/2005 | Nishimura et al. | EP | 00893677 B1 | 1/1999 |
| 2005/0025975 | A1 | 2/2005 | Okamoto et al. | EP | 0624353 B1 | 2/1999 |
| 2005/0035222 | A1 | 2/2005 | Hamada et al. | EP | 0656458 B1 | 2/1999 |
| 2005/0037879 | A1 | 2/2005 | Murata et al. | EP | 0 905 221 A1 | 3/1999 |
| 2005/0056241 | A1 | 3/2005 | Nomura et al. | EP | 0 905 419 | 3/1999 |
| 2005/0061291 | A1 | 3/2005 | Nishimura et al. | EP | 0647318 B1 | 3/1999 |
| 2005/0061636 | A1 | 3/2005 | Frost et al. | EP | 0651069 B1 | 3/1999 |
| 2005/0064196 | A1 | 3/2005 | Martin et al. | EP | 0949200 A1 | 10/1999 |
| 2005/0082139 | A1 | 4/2005 | Ishikawa et al. | EP | 0845154 B1 | 11/1999 |
| 2005/0084390 | A1 | 4/2005 | Ueno et al. | EP | 0624354 B1 | 12/1999 |
| 2005/0089685 | A1 | 4/2005 | Hamada et al. | EP | 0582676 B1 | 3/2000 |
| 2005/0098134 | A1 | 5/2005 | Nishimura et al. | EP | 1063085 A1 | 12/2000 |
| 2005/0100701 | A1 | 5/2005 | Hamada et al. | EP | 1 067 211 | 1/2001 |
| | | | | EP | 0850126 B1 | 1/2001 |
| | | | | EP | 1076087 | 2/2001 |
| | | | | EP | 1078736 A1 | 2/2001 |

| | | | | | | |
|---|---|---|---|---|---|---|
| EP | 1109196 A1 | 6/2001 | | JP | 2000-297373 A | 10/2000 |
| EP | 0778902 B1 | 9/2001 | | JP | 2000-327484 A | 11/2000 |
| EP | 1 154 012 | 11/2001 | | JP | 2000-339083 | 12/2000 |
| EP | 1034320 B1 | 12/2001 | | JP | 2001-62605 | 3/2001 |
| EP | 0850133 B1 | 1/2002 | | JP | 2001-064005 A | 3/2001 |
| EP | 0893677 B1 | 1/2002 | | JP | 2001-93141 A2 | 4/2001 |
| EP | 1164460 A2 | 3/2002 | | JP | 2001-172766 A | 6/2001 |
| EP | 1190791 A3 | 4/2002 | | JP | 2001-172766 A2 | 6/2001 |
| EP | 1219464 A2 | 7/2002 | | JP | 2001-192864 | 7/2001 |
| EP | 1 233 054 A1 | 8/2002 | | JP | 2001-269938 | 10/2001 |
| EP | 0971812 B1 | 10/2002 | | JP | 2001-280236 | 10/2001 |
| EP | 1018291 B1 | 10/2002 | | JP | 2002-265968 A2 | 9/2002 |
| EP | 1281513 A2 | 2/2003 | | JP | 2002-309912 A | 10/2002 |
| EP | 1 300 608 | 4/2003 | | JP | 2002-332571 | 11/2002 |
| EP | 0950123 B1 | 5/2003 | | JP | 2003-13163 | 1/2003 |
| EP | 0882759 B1 | 6/2003 | | JP | 2003-13799 | 1/2003 |
| EP | 1 338 641 | 8/2003 | | JP | 2003-25117 | 1/2003 |
| EP | 1340605 A1 | 9/2003 | | JP | 2003-28174 A2 | 1/2003 |
| EP | 1365141 A1 | 11/2003 | | JP | 2003-088939 A | 3/2003 |
| EP | 1083946 B1 | 12/2003 | | JP | 2003-113941 | 4/2003 |
| EP | 1078736 B1 | 1/2004 | | JP | 2003-147508 | 5/2003 |
| EP | 1378271 A1 | 1/2004 | | JP | 2004-36788 A2 | 2/2004 |
| EP | 0757615 B1 | 3/2004 | | JP | 2005-68529 A2 | 3/2005 |
| EP | 0842754 B1 | 3/2004 | | RU | 2004586 C1 | 12/1993 |
| EP | 1 411 145 | 4/2004 | | RU | 2153782 C1 | 7/2000 |
| EP | 0862395 B1 | 4/2004 | | SU | 1770350 A1 | 10/1992 |
| EP | 1 418 353 A2 | 5/2004 | | WO | WO89/06707 A1 | 7/1989 |
| EP | 1440775 A1 | 7/2004 | | WO | WO89/06708 A1 | 7/1989 |
| EP | 1445119 A1 | 8/2004 | | WO | WO8906338 A1 | 7/1989 |
| EP | 1475557 A1 | 11/2004 | | WO | WO92/02602 | 2/1992 |
| EP | 1481699 A1 | 12/2004 | | WO | WO9206843 A1 | 4/1992 |
| EP | 1482190 A2 | 12/2004 | | WO | WO9219425 A2 | 11/1992 |
| EP | 1498597 A1 | 1/2005 | | WO | WO93/21288 | 10/1993 |
| EP | 1 510 594 A2 | 3/2005 | | WO | WO93/21289 | 10/1993 |
| EP | 1311885 B1 | 3/2005 | | WO | WO9324828 A1 | 12/1993 |
| EP | 1512781 A2 | 3/2005 | | WO | WO95/20253 A2 | 7/1995 |
| EP | 1183470 B1 | 4/2005 | | WO | WO95/29044 A1 | 11/1995 |
| FR | 2 669 689 | 5/1992 | | WO | WO95/29273 A1 | 11/1995 |
| GB | 768226 | 2/1957 | | WO | WO95/31584 A1 | 11/1995 |
| GB | 1005638 | 10/1988 | | WO | WO96/04485 | 2/1996 |
| GB | 2338716 | 12/1999 | | WO | WO96/05333 A1 | 2/1996 |
| IE | 0990532 A1 | 3/2001 | | WO | WO96/05942 A1 | 2/1996 |
| JP | 62-111106 | 5/1987 | | WO | WO96/06961 A1 | 3/1996 |
| JP | 63-21209 A2 | 1/1988 | | WO | WO96/12389 A1 | 4/1996 |
| JP | 63-288994 A2 | 11/1988 | | WO | WO96/24488 A1 | 8/1996 |
| JP | 5-70879 | 3/1993 | | WO | WO96/40446 A1 | 12/1996 |
| JP | 5-36004 | 5/1993 | | WO | WO97/07531 A1 | 2/1997 |
| JP | 5-42616 | 6/1993 | | WO | WO97/10093 A1 | 3/1997 |
| JP | 6-264993 | 9/1994 | | WO | WO97/10940 A1 | 3/1997 |
| JP | 6-294307 | 10/1994 | | WO | WO97/14555 A1 | 4/1997 |
| JP | 7-41386 A2 | 2/1995 | | WO | WO97/16138 A1 | 5/1997 |
| JP | 07-090553 | 4/1995 | | WO | WO98/02715 A1 | 1/1998 |
| JP | 7-103238 | 4/1995 | | WO | WO98/12994 A1 | 4/1998 |
| JP | 07-118832 A | 5/1995 | | WO | WO98/13528 A1 | 4/1998 |
| JP | 7-63135 | 10/1995 | | WO | WO98/47141 A1 | 10/1998 |
| JP | 7-286696 | 10/1995 | | WO | WO99/09547 A1 | 2/1999 |
| JP | 8-14014 | 1/1996 | | WO | WO99/12404 A1 | 3/1999 |
| JP | 8-61499 | 3/1996 | | WO | WO99/14512 A1 | 3/1999 |
| JP | 9-20981 A2 | 1/1997 | | WO | WO99/16371 A1 | 4/1999 |
| JP | 52006318 | 1/1997 | | WO | WO99/22694 A2 | 5/1999 |
| JP | 253770 A2 | 9/1997 | | WO | WO99/27157 A1 | 6/1999 |
| JP | 10-088369 A2 | 4/1998 | | WO | WO99/29477 A1 | 6/1999 |
| JP | 10-265790 | 10/1998 | | WO | WO99/31557 A1 | 6/1999 |
| JP | 10-298440 A2 | 11/1998 | | WO | WO99/34385 A1 | 7/1999 |
| JP | 11-22423 | 1/1999 | | WO | WO99/46847 A1 | 9/1999 |
| JP | 11-190406 | 7/1999 | | WO | WO99/54520 A1 | 10/1999 |
| JP | 11-292629 A2 | 10/1999 | | WO | WO99/54934 A1 | 10/1999 |
| JP | 11-294118 A | 10/1999 | | WO | WO99/57743 A1 | 11/1999 |
| JP | 11-333773 A2 | 12/1999 | | WO | WO99/62077 A1 | 12/1999 |
| JP | 2000-008155 | 1/2000 | | WO | WO99/62572 A1 | 12/1999 |
| JP | 2000-88104 | 3/2000 | | WO | WO 00/22613 A1 | 4/2000 |
| JP | 2000-119843 | 4/2000 | | WO | WO 00/24554 A1 | 5/2000 |
| JP | 2000-504089 | 4/2000 | | WO | WO 00/25410 A1 | 5/2000 |

| | | |
|---|---|---|
| WO | WO 00/28142 A1 | 5/2000 |
| WO | WO 00/33051 A1 | 6/2000 |
| WO | WO 00/35000 A1 | 6/2000 |
| WO | WO 00/44032 A1 | 7/2000 |
| WO | WO 00/47402 A1 | 8/2000 |
| WO | WO 00/55385 A1 | 9/2000 |
| WO | WO 00/56127 A1 | 9/2000 |
| WO | WO 00/56393 A1 | 9/2000 |
| WO | WO 00/62327 A2 | 10/2000 |
| WO | WO 00/68451 A2 | 11/2000 |
| WO | WO 00/75517 A1 | 12/2000 |
| WO | WO 00/78504 A1 | 12/2000 |
| WO | WO 01/05917 | 1/2001 |
| WO | WO 01/006033 A1 | 2/2001 |
| WO | WO 01/14736 A1 | 3/2001 |
| WO | WO 01/14745 A1 | 3/2001 |
| WO | WO 01/26862 A1 | 4/2001 |
| WO | WO 01/37631 A2 | 5/2001 |
| WO | WO 01/40537 A1 | 6/2001 |
| WO | WO 01/47451 A1 | 7/2001 |
| WO | WO 01/59544 A2 | 8/2001 |
| WO | WO 01/61182 | 8/2001 |
| WO | WO 01/61719 A1 | 8/2001 |
| WO | WO 01/62372 A1 | 8/2001 |
| WO | WO 01/63639 A1 | 8/2001 |
| WO | WO 01/67834 A1 | 9/2001 |
| WO | WO 01/79583 A2 | 10/2001 |
| WO | WO 01/80224 A2 | 10/2001 |
| WO | WO 02/006875 A1 | 1/2002 |
| WO | WO 02/13188 A1 | 2/2002 |
| WO | WO 02/24601 A1 | 3/2002 |
| WO | WO 02/24603 A1 | 3/2002 |
| WO | WO 02/24970 A2 | 3/2002 |
| WO | WO 02/32625 A2 | 4/2002 |
| WO | WO 02/44440 A1 | 6/2002 |
| WO | WO 02/054454 A2 | 7/2002 |
| WO | WO 02/062714 A2 | 8/2002 |
| WO | WO 02/073021 | 9/2002 |
| WO | WO 02/080996 A1 | 10/2002 |
| WO | WO 02/085237 A2 | 10/2002 |
| WO | WO 02/090461 A1 | 11/2002 |
| WO | WO 02/097289 A1 | 12/2002 |
| WO | WO 03/009978 A1 | 2/2003 |
| WO | WO 03/013990 A1 | 2/2003 |
| WO | WO 03/020329 A1 | 3/2003 |
| WO | WO 03/021731 A1 | 3/2003 |
| WO | WO 03/031543 A2 | 4/2003 |
| WO | WO 03/046508 A3 | 6/2003 |
| WO | WO 03/054876 A1 | 7/2003 |
| WO | WO 03/076309 A2 | 9/2003 |
| WO | WO 03/078679 A1 | 9/2003 |
| WO | WO 03/091758 A2 | 11/2003 |
| WO | WO 03/095009 A1 | 11/2003 |
| WO | WO 03/105134 A1 | 12/2003 |
| WO | WO 04/001804 A2 | 12/2003 |
| WO | WO 2004/004998 A1 | 1/2004 |
| WO | WO 2004/019809 A2 | 3/2004 |
| WO | WO 2004/024206 A1 | 3/2004 |
| WO | WO 2004/026359 A1 | 4/2004 |
| WO | WO 2004/026500 A2 | 4/2004 |
| WO | WO 2004/036169 A1 | 4/2004 |
| WO | WO 2004/036292 A2 | 4/2004 |
| WO | WO 2004/038701 A2 | 5/2004 |
| WO | WO 2004/043631 A1 | 5/2004 |
| WO | WO 2004/048126 A1 | 6/2004 |
| WO | WO 2004/067466 A1 | 8/2004 |
| WO | WO 2004/068530 A1 | 8/2004 |
| WO | WO 2004/071670 A1 | 8/2004 |
| WO | WO 2004/072959 A2 | 8/2004 |
| WO | WO 2004/078424 A2 | 9/2004 |
| WO | WO 2004/084773 A1 | 10/2004 |
| WO | WO 2004/088113 A1 | 10/2004 |
| WO | WO 2005/010596 A2 | 2/2005 |
| WO | WO 2005/011744 A2 | 2/2005 |
| WO | WO 2005/014760 A1 | 2/2005 |
| WO | WO 2005/014882 A1 | 2/2005 |
| WO | WO 2005/016620 A2 | 2/2005 |
| WO | WO 2005/021851 A1 | 3/2005 |
| WO | WO 2005/025844 A1 | 3/2005 |
| WO | WO 2005/034791 A1 | 4/2005 |
| WO | WO 2005/037144 A2 | 4/2005 |
| WO | WO 2005/037985 A2 | 4/2005 |
| WO | WO 2005/040451 A1 | 5/2005 |
| WO | WO 2005/042064 A1 | 5/2005 |
| WO | WO 2005/047737 A1 | 5/2005 |

OTHER PUBLICATIONS

Gåhlin, Rickard et al., "ME-C:H Coatings in Motor Vehicles," *WEAR* 249, 2001, pp. 302-309.

Hershberger, J., et al., "Evaluation of DLC Coatings for Spark-Ignited, Direct-Injected Fuel Systems," *Surface & Coatings Technology*. 179, 2004, pp. 237-244.

Hershberger, J, et al., "Friction and Wear Behavior of Near-Frictionless Carbon Coatings in Formulated Gasolines," *Surface & Coating Technology*, 183, 2004, pp. 111-117.

Kovalchenko, A., et al., "Friction and Wear Performance of Low-Friction Carbon Coatings Under Oil Lubrication," Energy Technology Div., Argonne National Laboratory.

Ajayi, O., et al., "Effect of Carbon Coating on Scuffing Performance in Diesel Fuels," *Tribology Transactions*, vol. 44, 2001, pp. 298-304.

Ajayi, O., et al., Effect of Thin-Film Coating on Wear in EGR-Contaminated Oil, Energy Technology Div., Argonne National Laboratory.

Fujimori, N., et al., "Characterization of Conducting Diamond Films," *Vacuum*, vol. 36, Nos. 1-3, 1996, pp. 99-102.

Patent/Literature Search Report, Bawa Biotechnology Consulting, LLC, Jun. 3, 2005 (201 pages).

"Aluminum Alloy Die Castings," Japanese Industrial Standard (JIS H 5302), 2000, pp. 1-12.

"Aluminum Alloys Castings", Japanese Industrial Standard (JIS H 5202), 1999, pp. 1-18.

Japanese Industrial Standard, "Aluminum Alloy Castings", JIS H 5202, 1999, pp. 1910, 1911 and 1636-1647.

"Aluminum Alloy Die Castings," JIS H5302 (2000), pp. 1670-1681.

"Assessment of 2nd to 5th Order Irregularities of Surface Configuration by Means of Sections of Surfaces Definitions Relating to Reference System and Dimensions," DIN 4762, UDC 621-288:001.4

API Motor Oil Guide, Which Oil is Right for You, American Petroleum Institute, Copyright 2002.

"Carbon Steels for Machine Structural Use", Japanese Industrial Standard (JIS G 4051), 1979, pp. 1381-1383.

"Carbon Steels for Machine Structural Use", Japanese Industrial Standard (JIS G 4051), 1979, pp. 1-10.

"Chromium Molybdenum Steels," Japanese Industrial Standard (JIS G 4105), 1979, pp. 1-11 (with Translation).

D.G. Watson et al., "Engineering Drawing Practice," XP002281300, University of Hertfordshire, Sep. 1991, p. 29, Figure 38.

Database WPI, Nov. 28, 2000, Derwent Publications, Ltd., AN 2000640583, XP002240184, JP 2000-327484, Nov. 28, 2000.

Dr. Marx, "Surfaces and Contact Mechanics", XP-002233233, Google, Retrieved from the Internet, Mar. 3, 2003, pp. 1-18.

Engine Oil Viscosity Classification—SAE J300 revised Apr. 1997, p. 133.

"Geometrical Product Specifications (GPS)—Surface Texture: Profile Method—Terms, Definitions and Surface Texture Parameters," International Standard, ISO 4287, TC 213 (1997), pp. 1-25.

"Geometrical Product Specifications (GPS)—Surface texture: Profile method—Terms, definitions and surface texture parameters", Japanese Industrial Standard (JIS B 0601) Machine Elements, 2003, pp. 6, 7, 263-287, and 2586.

"Grey iron castings", Japanese Industrial Standard (JIS G 5501), pp. 2075-2077.

Japanese Industrial Standard, "High Carbon Chromium Bearing Steels", JIS G 4805, 1999, pp. 1-31 (with translation).

International Standard "Application of Carbides for Machining by Chip Removal—Designation of the Main Groups of Chip Removal and Groups of Application," ISO 513, (1975), pp. 67-69.

International Standard, "Petroleum products—Determination of base number—Perchloric acid potentiometric titration method", ISO 3771, second edition Aug. 15, 1994, pp. 1-8.

Japanese Industrial Standard, "Structural Steels with Specified Hardenability Bands", JIS G 4052, 1979, pp. 2414, 2415, 1390-1403, 1410 and 1411.

JIS Japanese Industrial Standard; "Surface Roughness—Definitions and Designation"; JIS B 0601; 1994. (w/Translation).

JIS Japanese Industrial Standard; "Vickers Hardness Test—Test Method"; JIS Z 2244; 1998; (w/Translation).

Japanese Industrial Standard, 2001, No. B 0601.

K. Holmberg et al., "Tribological Characteristics of Diamond-like Carbon Coatings," VTT Symposium, Technical Research Centre of Finland, XP000570636, 1994, pp. 24-238.

Kano et al., "Friction Characteristics of a Hard Carbon Film in Engine Oil, (No. 2) (Surface Analysis Result of Sliding Surface)," Japan Tribology Congress 1999, 5, pp. 11-12.

M. Kano et al., "The Effect of ZDDP and MODTC Additives on Friction Properties of DLC and Steel Cam Follower in Engine Oil", Abstracts of Papers from 2nd World Tribology Congress, Sep. 3-7, 2001, p. 342.

Meyer-Rässler, "Neuartige Laufflächen-Schutzverfahren für Kolben von Verbrennungsmotoren," VDI-Zeitschrift, 1942, vol. 86, No. 15/16, pp. 245 to 247.

Patent Abstracts of Japan, vol. 1996, No. 09, Sep. 30, 1996, JP 08-128448, May 21, 1996.

Patent Abstracts of Japan, vol. 2000, No. 01, Jan. 31, 2000, JP 11-287329, Oct. 19, 1999.

Patent Abstracts of Japan, vol. 2000, No. 09, Oct. 13, 2000, JP 2000-170768, Jun. 20, 2000.

PCT/IB2004/002552.

"Stainless Steel Bars", Japanese Industrial Standard (JIS G 4303), pp. 1457-1477.

"Standard Practice for Codification of Certain Nonferrous Metals and Alloys, Cast and Wrought1", ASTM International, Designation: B 275-02, Jun. 2002, pp. 1-7.

"Standard Test Method for Calibration and Operation of the Falex Block-on-Ring Friction and Wear Testing Machine", ASTM Designation: D2714-88, Jan. 1989, pp. 383-386.

"Standard Test Method for Separation of Representative Aromatics and Nonaromatics Fractions of High-Boiling Oils by Elution Chromatography", ASTM Designation: D 2549-91 (Reapproved 1995), pp. 895-900.

Steve J. Bull et al., "High-Performance Diamond and Diamond-like Coatings", JOM, Apr. 1995, pp. 16-19, vol. 47, No. 4, XP 000500980.

Patent Abstracts of Japan, vol. 2003, No. 12, Dec. 5, 2003, JP 2004-155891, Jun. 3, 2004.

U.S. Appl. No. 10/911,741, filed May 5, 2004, Ueno.

Ronkainen, Helena, "Tribological Properties of Hydrogenated and Hydrogen-Free Diamond-Like Carbon Coatings," Disseration for the Degree of Doctor of Science Science in Technology, VTT Publications No. 434.

* cited by examiner

SLIDING STRUCTURE FOR AUTOMOTIVE ENGINE

The present application is a continuation of U.S. application Ser. No. 10/682,559, filed Oct. 10, 2003 now U.S. Pat. No. 6,886,521, the entire contents of which are incorporated herein by reference.

BACKGROUND OF THE INVENTION

The present invention relates to a sliding structure for an automotive internal combustion engine that has excellent friction characteristics and high durability. More specifically, the present invention relates to a sliding structure for use in an automotive engine valve train or intake/exhaust system in which the sliding portion of a sliding member is coated with a specific hard carbon film to attain a low friction coefficient and high durability, reliability and seizure resistant.

A valve train and an intake/exhaust system of an automotive internal combustion engine include various sliding members, such as a cam lobe and its counterpart member, i.e., a valve lifter or a shim attached to an end face of the lifter. Above all, the sliding friction between the cam lobe and the lifter accounts for 20% of the total engine mechanical loss when the engine runs at low speeds (including idling speed). The technique of reducing the friction between the cam lobe and the lifter is important to provide a direct improvement of vehicle fuel efficiency. Herein, the surface pressure developed by sliding contact between the cam lobe and the lifter is among the highest in the internal combustion engine, and the lubrication between the cam lobe and the lifter is temporarily cut off due to their sliding mechanism. It can be thus said that the lubrication state of the cam lobe and the lifter is extremely severe. There are some conceivable effective ways to reduce the sliding friction between the cam lobe and the lifter. For example, the sliding portions of both the cam lobe and the lifter can be smoothed to improve the lubrication state and thereby reduce direct contact (metal contact) between the cam lobe and the lifter. A solid lubricant or lubricant additive may be used to reduce the friction on metal contact between the cam lobe and the lifter. In view of the foregoing, it is proposed to smooth the sliding portion of the lifter, and then, coat the sliding portion with a hard thin film of titanium nitride (TiN) or chromium nitride ($Cr_2N$) or a resinous material containing therein a solid lubricant e.g. molybdenum disulfide ($MoS_2$).

The greatest merit of a hard thin film formed by a physical vapor deposition (PVD) method or a chemical vapor deposition (CVD) method is its surface hardness much higher than that attained by surface treating (e.g. plating) or surface hardening (e.g. heat treatment). By the application of such a hard thin film to a sliding member, the wear resistance of the sliding member can be significantly improved to prevent a deterioration in surface roughness under lubrication. Also, the sliding member can be prevented from wearing away its counterpart member due to the deterioration in surface roughness. It is thus possible to keep the sliding friction from increasing owing to an increase in the direct contact (metal contact) between the sliding member and the counterpart member and possible to maintain the initial lubrication state over an extended time period. In addition, it is expected that the application of the hard thin film to the sliding member would provide a smoothing effect on the counterpart member such that the sliding portions of both the sliding member and the counterpart member can be smoothed for improvement of the lubrication state.

Among various hard carbon films, amorphous carbon films such as a diamond-like carbon (DLC) film are known for high hardness and solid-lubricant-like ability to provide a low friction coefficient with no lubricant. In microscopic analysis, the sliding contact between the sliding member and the counterpart member under lubrication includes a region in which the sliding member makes sliding contact with the counterpart member via a lubricant film and a region in which the sliding member and the counterpart member make direct contact (metal contact) between their surface roughness peaks. With the expectation that the sliding friction between the sliding member and the counterpart member can be reduced under no lubrication, the application of the DLC film to the sliding member, notably the region in which the sliding member makes direct contact with the counterpart member, has been recently examined as a low-friction technique for the internal combustion engine.

However, the hard carbon film formed by the PVD or CVD method has higher internal stress and hardness than that formed by surface treating (e.g. plating). In the application of such a hard carbon film to the sliding member, there arise a problem that the hard thin film often becomes separated from the base portion of the sliding member and/or becomes cracked.

In order to prevent the separation of the hard carbon film, it is proposed to provide an intermediate layer so as to improve the adhesion between the film and the base, and to form the film in a multilayer structure to lessen the film internal stress. On the other hand, there are few proposals of preventing the cracking of the hard carbon film and the separation of the hard carbon film resulting from the film cracking by controlling the surface roughness and profile of the hard thin film as well as the surface roughness and profile of the counterpart member. One of such proposals is to control the surface roughness of the cam lobe and the lifter shim (Japanese Laid-Open Patent Publication No. JP11-294118A). This proposal is based on the principle that the input of load to the film can be controlled by limiting the roughness of the cam lobe and the lifter shim to a given value or smaller. Another proposal is to control the surface profile of the hard carbon film, more specifically to control the height and amount of macro particles (droplets) remaining on the surface of the film formed by arc ion plating (Japanese Laid-Open Patent Publication No. JP7-118832A).

SUMMARY OF THE INVENTION

Some studies have been conducted on the sliding between the cam lobe and the lifter as described above, but very few on the sliding between the cam lobe and the other sliding member and between the other sliding members. Particularly, any study based on the comprehensive analysis of the thickness, hardness and surface roughness of the hard carbon film, the surface roughness of the base portion of the sliding member and the properties of the lubricant, cannot be found.

In addition, the hard carbon film is more brittle than the previously known TiN and CrN films so that the hard carbon film needs to be controlled according to film properties. In order for the sliding member to attain a low friction coefficient and improved durability, reliability and seizure resistance, the influence of lubricant additives also needs to be considered.

It is therefore an object of the present invention to provide a sliding structure for an automotive engine in which the sliding portion of a sliding member is coated with a hard carbon film so as to attain a lower friction coefficient, higher durability and reliability and improved seizure resistance while preventing the cracking and separation of the hard carbon film.

As a result of extensive researches, the inventors have found that the above object can be achieved by adequately controlling the surface roughness and profile of a hard carbon film (such as a diamond-like carbon film), the surface roughness and profile of the base of a sliding member and the properties of a lubricant. The present invention has been accomplished based on this finding.

According to an aspect of the invention, there is provided a sliding structure for an automotive engine, comprising: a sliding member being one selected from the group consisting of a piston ring, a piston pin, a cam lobe, a cam journal, a plain bearing, a rotary vane and a timing chain, and including a sliding portion; and a lubricant applied to the sliding portion so that the sliding portion can make sliding contact with a counterpart member via the lubricant, wherein the sliding portion has a base made of either a steel material or an aluminum material and a hard carbon film formed on the base to coat the sliding portion, and the hard carbon film has a thickness of 0.3 to 2.0 μm, a Knoop hardness of 1500 to 4500 kg/mm$^2$, a surface roughness Ry (μm) satisfying the following equation: Ry<{(0.75−Hk/8000)×h+0.07/0.8} where h is the thickness (μm) of the hard carbon film; and Hk is the Knoop hardness (kg/mm$^2$) of the hard carbon film.

The other objects and features of the invention will also become understood from the following description.

DESCRIPTION OF THE EMBODIMENTS

The present invention will be described below in detail. In the following description, all percentages (%) are by mass unless otherwise specified.

A sliding structure according to one exemplary embodiment of the invention includes a sliding member having a sliding portion and a lubricant applied to the sliding portion so that the sliding portion can make sliding contact with a counterpart member via the lubricant.

Figure 1A:
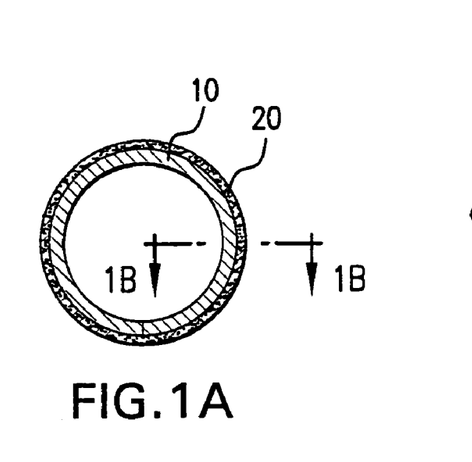
FIG. 1A is a schematic that presents an axial view of a piston ring according to an embodiment of the present invention.
Figure 1B:
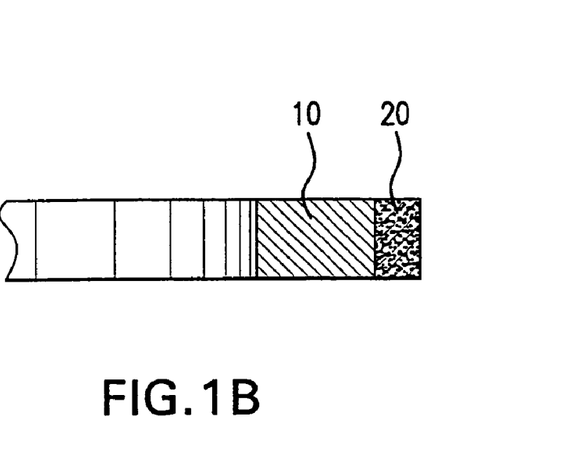
FIG. 1B is a schematic depicting the cross section 1B—1B of FIG. 1A.
Figure 2A:
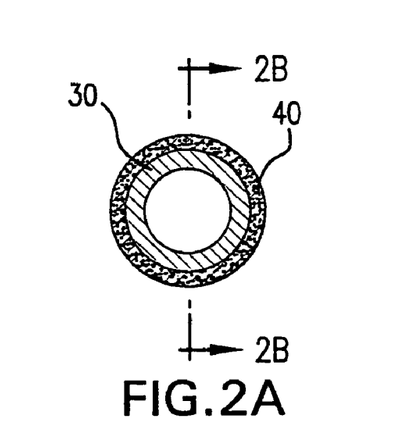
FIG. 2A is a schematic that presents an axial view of a piston pin according to an embodiment of the present invention.
Figure 2B:
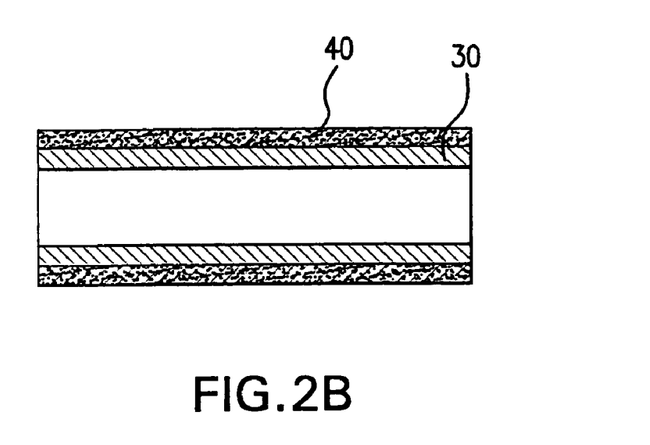
FIG. 2B is a schematic depicting the cross section 2B—2B of FIG. 2A.

The sliding member is designed specifically for use in an automotive engine, and can be in the form of a piston ring, as is represented by way of example only in FIGS. 1A and 1B, a piston pin, as is represented by way of example only in FIGS. 2A and 2B, a piston skirt, a cam lobe, a cam journal, a plain bearing, a rotary vane or a timing chain, or varying combinations thereof. Herein, the piston ring is a ring fit onto a piston to slide against a cylinder. The piston pin is a pin that connects a piston to a connecting rod and slides against the piston, bushing or the connecting rod. The piston skirt is the skirt part of a piston that slides against a cylinder. Each of the cam lobe and the cam journal is used for a camshaft to slide against a valve lifter or a shim so as to drive intake and exhaust valves. The rotary vane is rotatably mounted in the housing (that defines a pump chamber) of an oil pump (such as a base pump) of an automatic transmission so as to slide against the housing, or is rotatably mounted in the cylindrical housing of a hydraulic circuit of a valve train (that variably controls the valve lift characteristics of an intake or exhaust valve) so as to slide against the housing. The timing chain is a continuous roller chain that slides against a sprocket or chain guide so as to drive a camshaft from a crankshaft.

The sliding portion of the sliding member has a base and a hard carbon film formed on the base to coat the sliding portion. By way of example only, the base of the piston ring according to an exemplary embodiment is represented by element 10 in FIGS. 1A and 1B, while the base of the piston pin according to an exemplary embodiment is represented by element 30 in FIGS. 2A and 2B. Further by way of example only, the hard carbon film of the piston ring according to an exemplary embodiment is represented by element 20 in FIGS. 1A and 1B, while the hard carbon film of the piston pin according to an exemplary embodiment is represented by element 40 in FIGS. 2A and 2B.

The base is generally made of either one of a steel material and an aluminum material.

The hard carbon film is made of carbon that contains unavoidable impurities only, and is desirably a diamond-like carbon (DLC) film. Although the DLC film can be formed by any physical vapor deposition (PVD) method, it is particularly desirable to form the DLC film by arc ion plating.

Further, the hard carbon film has a thickness of 0.3 to 2.0 μm, a surface hardness of 1500 to 4500 kg/mm$^2$ in terms of Knoop hardness and a surface roughness Ry (μm) satisfying the following equation (A):

$$Ry<\{(0.75-Hk/8000)\times h+0.07/0.8\} \tag{A}$$

where h is the thickness (μm) of the hard carbon film; and Hk is the Knoop hardness (kg/mm$^2$) of the hard carbon film.

The above equation (A) has been experimentally established by the inventors. Namely, experiments have been conducted on the sliding of various combinations of the above sliding members and their counterpart members to find out how the occurrence of damage and separation of the hard carbon film can be influenced by the hardness, surface roughness and thickness of the hard carbon film, the surface roughness and profile of the base and the surface roughness and profile of the counterpart member. As a result of the experiments, it is found that that the hard carbon film sustains damage from sliding when subjected to an excessively large load. It is also found that such damage of the hard carbon film results in film cracking, microscopic film separation or more serious damage caused by scrubbing separated film fragments.

If one of the sliding member and the counterpart member has its sliding portion formed into a plane and the other has its sliding portion formed into a simple curvature, the sliding member and the counterpart member make line contact between their sliding portions such that the hard carbon film receives only a pressure from the line contact. In this case, the hard carbon film can be prevented from becoming cracked by controlling the thickness of the hard carbon film to a give value or larger, without the need to consider the relationship of the above equation (A). In practice, however, there are the following causes for the excessive load on the hard carbon film.

One cause for the excessive load on the hard carbon film is a deposit specific to the thin film formed by any PVD method (such as arc ion plating). The deposit is herein defined as particles coming from the metal target (i.e. the source of a film forming material) in a cluster or molten state but not in an ionic or atomic state, and remaining in the film as they are. The hard carbon film is developed over the deposit so that the deposit remains within the film to form hard particulate protrusions. These protrusions readily come off during the sliding. If the resultant particles are caught into the contact between the sliding member and the counterpart member, the hard carbon film receives a pressure from the counterpart member via the particles. Such a localized pressure is much higher than a Hertz's pressure determined based on the macroscopic curvature of the sliding or counterpart member in consideration of its elastic deformation, and can cause cracking of the film. The hard carbon film is also subjected to shearing stress upon the sliding contact between the sliding member and the counterpart member. The damage of the hard carbon film is developed radially outwardly in line form to cause macroscopic separation of the film.

Another cause for the excess load on the hard carbon film is too large surface roughness of the counterpart member. There are two cases: in one case, the surface roughness peaks of the counterpart member increases the localization of the surface pressure on the film; and, in the other case, the sliding member and the counterpart member make point contact rather than line contact due to their low smoothness to make the contact pressure more localized. Especially when the sliding member and the counterpart member make point contact due to their low smoothness, the cracking of the hard carbon film becomes increasingly promoted under the combined influence of the deposit and the large surface roughness of the sliding member and the counterpart member.

It is also found by the inventors that the cracking of the hard carbon film can be caused depending on the thickness and hardness of the film. As the thickness of the film increases, the deformation of the film caused by pressing the particles against the film under a given load becomes small. The resistance of the film to cracking thus increases. In order to bring about a good lubrication state, it is necessary that the hard carbon film have a certain thickness depending on a conceivable load applied under the sliding conditions. In addition, the hardness and ductility of the film are generally traded off for each other, and the hardness of the film increase with decrease in the ductility of the film. Accordingly, the resistance of the film to cracking increases as the hardness of the film measurably decreases.

The input of load that the hard carbon film (notably the DLC film) can tolerate depends on the surface roughness, thickness and hardness of the film. By adjusting the surface roughness and profiles of the hard carbon film, the base of the sliding member and the counterpart member adequately according to conceivable sliding conditions of the sliding member, it is possible to control the input of load on the film to within certain limits. The hard carbon film can be therefore prevented from becoming cracked and separated such that the film can maintain and perform its function properly over an extended time period.

Based on the above facts, the equation (A) has been established as follows.

It is now assumed that the hard carbon film has a thickness h, a Knoop hardness Hk, a depth h' at which the deposit particles or the roughness peaks of the counterpart member can be pushed into the film upon contact between the sliding member and the counterpart member.

The following equation (1) is experimentally given on the above assumption:

$$h'/h = 0.6 - Hk/10000 \quad (1).$$

The following equation (2) is also experimentally given:

$$a = 0.8 Ry - 0.07 \quad (2)$$

where a is a height of the deposit remaining in the hard carbon film; and Ry is a surface roughness Ry of the hard carbon film. The deposit remaining in the hard carbon film can be prevented from causing the damage of the film and the cracking and separation of the film resulting from the film damage, by controlling the surface roughness of the film. Namely, the deposit is desired to fit in the above push-in depth to satisfy the following equation (3):

$$a < h' \quad (3).$$

The equation (A) is derived from the equations (1) to (3), so that the surface roughness of the hard carbon film can be controlled according to the hardness and thickness of the film.

The restrictive conditions of the equation (A) will be now explained. The thickness h of the hard carbon film is controlled to 0.3 to 2.0 μm, as described above. When the thickness of the film is less than 0.3 μm, there arises a crack in the film under a conceivable load input from the counterpart member. On the other hand, when the thickness of the film exceeds 2.0 μm, there arises large internal stress in the film during the process of film forming to thereby cause the film to become warped. The warping of the film results in point contact between the sliding member and the counterpart member, and the cracking of the film can be thus accelerated indirectly due to such poor contact. Also, the surface hardness Hk of the hard carbon film is controlled to 1500 to 4500 kg/mm$^2$, as described above, in view of the trade-off between hardness and ductility.

The surface roughness and profile of the base also needs to be controlled according to the kind and characteristics of the sliding member and the kind and properties of the lubricant. Herein, the surface roughness of the base refers to a roughness of the surface of the base on which the hard carbon film is to be formed and is thus normally measured before the formation of the hard carbon film on the base. Desirably, the base has a surface roughness of 0.03 μm or smaller in terms of Ra (arithmetic mean roughness). As the thickness of the hard carbon film is very small, the surface roughness of the base is reflected to the surface roughness of the film. When the surface roughness of the base is large, the contact surface pressure applied on the film becomes more localized due to the surface roughness peaks of the film to cause the cracking of the film. With the surface roughness Ra of the base being controlled to 0.03 μm or smaller, however, it becomes possible to prevent the film cracking and the film separation resulting from the film cracking. Moreover, the sliding portion is likely to become convex due to the residual stress of the hard carbon film depending on the profile of the base. If the height of convexity of the sliding portion is too large, the sliding member and the counterpart member undesiredly make point contact rather than line contact so that the surface pressure applied on the film becomes more localized and increased by the deposit and foreign material caught into the contact between the sliding member and the counterpart member. It is thus desirable to control the convexity of the sliding portion to 0.03 μm or lower after the formation of the film on the base.

The lubricant is predominantly composed of a base oil. The base oil preferably has a kinematic viscosity of 2 to 8 m²/s at 100° C. and a viscosity index of 80 or higher so as to provide a greater friction reducing effect.

Further, the lubricant can additionally contain at least one additive selected from the group consisting of an anti-wear agent, a detergent dispersant, a viscosity index improver, a friction modifier, an anti-forming agent, a pour-point depressant, a rust inhibitor and an antioxidant, so as to reduce the friction coefficient and improve the seizure resistance. Especially, the addition of the anti-wear agent in the lubricant provides a substantial reduction in the friction coefficient. The reason for this is not yet clarified, but it is thought that the film of the lubricant is attached to the hard carbon film by chemical adsorption to take a lubrication action more effectively.

The present invention will be described in more detail by reference to the following example. However, it should be noted that the following example is only illustrative and not intended to limit the invention thereto.

EXAMPLE

A sliding member was formed by preparing a cylindrical piece (as a base) of SCr steel in compliance with JIS G4104 and forming by PVD arc ion plating a DLC film on a surface of the SCr steel piece. The DLC film had a thickness h of 0.5 μm, a Knoop hardness Hk of 2170 kg/mm² and a surface roughness Ry of 0.03 μm.

COMPARATIVE EXAMPLE

In COMPARATIVE EXAMPLE, a cylindrical piece of SCr steel in compliance with JIS G4104 was used as a sliding member. The SCr steel piece used in COMPARATIVE EXAMPLE was the same as that used in EXAMPLE. No DLC film was formed on the SCr steel piece in COMPARATIVE EXAMPLE.

Evaluations

The sliding members of EXAMPLE and COMPARATIVE EXAMPLE were subjected to friction/wear test in order to measure their friction coefficients and seizure loads. The friction/wear test was conducted using a reciprocating-type (SRV) friction/wear tester under the following test conditions. The test results are shown in TABLE.

| [Test Conditions] | |
|---|---|
| Frequency: | 50 Hz |
| Temperature: | 25° C. |
| Load: | Increased at 130 N/min. |
| Lubricant: | SAE 5W30 |

TABLE

| | Friction Coefficient | Seizure Load (N) |
|---|---|---|
| EXAMPLE | 0.1 | 1110 |
| COMPARATIVE EXAMPLE | 0.17 | 610 |

It is apparent from TABLE that the sliding member of EXAMPLE had more excellent low-friction characteristics and higher seizure resistance than the sliding member of COMPARATIVE EXAMPLE.

As described above, it is possible in the sliding structure of the present embodiment to prevent the hard carbon film from becoming cracked and separated and to attain a low friction coefficient, high durability reliability and improved seizure resistance by adequately controlling the surface roughness and profile of the hard carbon film (notably DLC film), the surface roughness and profile of the base of the sliding member and the lubricant properties.

The entire contents of Japanese Patent Application No. 2002-302205 (filed on Oct. 16, 2002) are herein incorporated by reference.

Although the present invention has been described with reference to specific embodiments of the invention, the invention is not limited to the above-described embodiments. Various modification and variation of the embodiments described above will occur to those skilled in the art in light of the above teaching. The scope of the invention is defined with reference to the following claims.

What is claimed is:

1. A sliding structure comprising:
   a sliding member which comprises a first sliding surface; and
   a lubricant applied to the first sliding surface so that the first sliding surface can make sliding contact with a second sliding surface on a counterpart member via the lubricant,
   wherein at least one of the first sliding surface and the second sliding surface comprises a hard carbon film, and the hard carbon film has a thickness of 0.3 to 2.0 μm, a Knoop hardness of 1500 to 4500 kg/mm², a surface roughness Ry (μm) satisfying the following equation:

$$Ry < \{(0.75 - Hk/8000) \times h + 0.07/0.8\}$$

where h is the thickness (μm) of the hard carbon film; and Hk is the Knoop hardness (kg/mm²) of the hard carbon film.

2. A sliding structure according to claim 1, wherein the hard carbon film is a diamond-like carbon film formed by arc ion plating.

3. A sliding structure according to claim 1, wherein the base with a surface roughness Ra of 0.03 μm or smaller.

4. A sliding structure according to claim 1, wherein the sliding surface coated with the hard carbon film has a convexity of which maximum height is 0.3 μm or smaller.

5. A sliding structure according to claim 1, wherein the lubricant comprises a base oil having a kinematic viscosity of 2 to 8 m²/s at 100° C. and a viscosity index of 80 or higher.

6. A sliding structure according to claim 1, wherein the lubricant comprises at least one additive selected from the group consisting of an anti-wear agent, a detergent dispersant, a viscosity index improver, a friction modifier, an anti-forming agent, a pour-point depressant, a rust inhibitor and an antioxidant.

7. A sliding structure according to claim 1, wherein the base comprises a steel material or an aluminum material.

8. An automotive engine comprising a sliding structure according to claim 1.

9. A piston ring, a piston pin, a cam lobe, a cam journal, a plain bearing, a rotary vane or a timing chain comprising a sliding structure according to claim 1.

* * * * *